US009524848B2

(12) United States Patent
Hirsch

(10) Patent No.: US 9,524,848 B2
(45) Date of Patent: Dec. 20, 2016

(54) BRIGHT AND DURABLE FIELD EMISSION SOURCE DERIVED FROM REFRACTORY TAYLOR CONES

(71) Applicant: Gregory Hirsch, Pacifica, CA (US)

(72) Inventor: Gregory Hirsch, Pacifica, CA (US)

(\*) Notice: Subject to any disclaimer, the term of this patent is extended or adjusted under 35 U.S.C. 154(b) by 14 days.

(21) Appl. No.: 14/536,555

(22) Filed: Nov. 7, 2014

(65) Prior Publication Data

US 2015/0123010 A1    May 7, 2015

Related U.S. Application Data

(60) Provisional application No. 61/962,462, filed on Nov. 7, 2013.

(51) Int. Cl.
G21K 5/02      (2006.01)
H01J 37/073    (2006.01)
(Continued)

(52) U.S. Cl.
CPC ............ H01J 37/073 (2013.01); H01J 1/3044 (2013.01); H01J 9/025 (2013.01); H01J 37/08 (2013.01);
(Continued)

(58) Field of Classification Search
CPC combination set(s) only.
See application file for complete search history.

(56) References Cited

U.S. PATENT DOCUMENTS 4,264,641 A \* 4/1981 Mahoney ................ B05B 5/025
                                                     148/403
4,762,975 A    8/1988 Mahoney et al.
(Continued)

FOREIGN PATENT DOCUMENTS

JP    2006-068711 A    3/2006

OTHER PUBLICATIONS

L. W. Chen et al., 'Stable Field-Induced Electron Emission from a Solidified Liquid Metal Ion Source', In: Applied Physics Letters, vol. 72, Issue 3, Jan. 19, 1998, pp. 389-391, http://scitation.aip.org/content/aip/journal/apl/72/3/10.1063/1.120745.
Wolfram Knapp et al., 'Formation of a Nano-Emitter for Electron Field Emission on a Liquid Metal Ion Source Tip After Solidification of the Alloy', In: Vacuum, vol. 69, Issues 1-3, Dec. 24, 2002, pp. 345-349, http://www.sciencedirect.com/science/article/pii/S0042207X02003561.
M. Tajmar et al., 'New Materials and Processes for Field Emission Ion and Electron Emitters', In: CEAS Space Journal, vol. 4, Issues 1-4, Jun. 2013, pp. 47-54, http://link.springer.com/article/10.1007/s12567-013-0031-z.
(Continued)

*Primary Examiner* — Wyatt Stoffa
*Assistant Examiner* — Hsien Tsai
(74) *Attorney, Agent, or Firm* — Asif Ghias

(57) ABSTRACT

A method of producing field emitters having improved brightness and durability relying on the creation of a liquid Taylor cone from electrically conductive materials having high melting points. The method calls for melting the end of a wire substrate with a focused laser beam, while imposing a high positive potential on the material. The resulting molten Taylor cone is subsequently rapidly quenched by cessation of the laser power. Rapid quenching is facilitated in large part by radiative cooling, resulting in structures having characteristics closely matching that of the original liquid Taylor cone. Frozen Taylor cones thus obtained yield desirable tip end forms for field emission sources in electron beam applications. Regeneration of the frozen Taylor cones in-situ is readily accomplished by repeating the initial formation procedures. The high temperature liquid Taylor cones can also be employed as bright ion sources with chemical elements previously considered impractical to implement.

47 Claims, 8 Drawing Sheets

(51) Int. Cl.
*H01J 37/08* (2006.01)
*H01J 1/304* (2006.01)
*H01J 9/02* (2006.01)

(52) U.S. Cl.
CPC ............... *H01J 2201/30411* (2013.01); *H01J 2237/0805* (2013.01)

(56) References Cited

U.S. PATENT DOCUMENTS

| | | | | |
|---|---|---|---|---|
| 4,829,177 | A * | 5/1989 | Hirsch | H01J 37/285 250/306 |
| 5,153,901 | A * | 10/1992 | Shoulders | H01J 3/00 313/131 A |
| 5,554,859 | A * | 9/1996 | Tsukamoto | H01J 9/022 257/10 |
| 7,501,644 | B2 | 3/2009 | Zani et al. | |
| 7,827,779 | B1 * | 11/2010 | Krishnan | F03H 1/0012 313/360.1 |
| 8,080,930 | B2 | 12/2011 | King | |
| 2003/0052268 | A1 * | 3/2003 | Doroshenko | H01J 49/04 250/288 |
| 2003/0119246 | A1 * | 6/2003 | Ahn | C23C 14/16 438/216 |
| 2005/0111624 | A1 * | 5/2005 | Yada | G21K 7/00 378/136 |
| 2007/0274451 | A1 * | 11/2007 | Harding | H01J 35/08 378/131 |
| 2008/0253020 | A1 * | 10/2008 | Gierak | G11B 9/1409 360/110 |
| 2009/0153015 | A1 * | 6/2009 | King | F03H 1/00 313/359.1 |
| 2009/0179161 | A1 * | 7/2009 | Ward | B82Y 10/00 250/492.21 |
| 2010/0181493 | A1 * | 7/2010 | Sudraud | H01J 27/26 250/396 R |

OTHER PUBLICATIONS

PCT/US2014/064697, International Search Report and Written Opinion of the International Searching Authority, Applicant: Gregory Hirsch, International Filing Date: Nov. 7, 2014, Authorized Officer: Kim, Do Weon.

Antoine, et al., Electromigration Occurences and its Effects on Metallic Surfaces Submitted to High Electromagnetic Filed: A Novel Approach to Breakdown Accelerators, CEA, SACM Centre d'Etudes de Saclay, 2011, pp. 1-29, France.

Ganter, et al., High Current Electron Emission from Microscopic Tips, Proceedings of FEL 2006, BESSY, pp. 781-784, Berlin, Germany.

Knapp, et al., Electron emission characteristics of solidified gold alloy liquid metal ion sources, Applied Surface Science, No. 146, 1999, pp. 134-137.

Makela, et al., Progress on Re-generable Field Emission Cathodes for Low-Power Electric Propulsion, 30th International Electric Propulsion Conference (IEPC), 2007, pp. 1-9, Florence, Italy.

Ninomiya, et al., Vacuum electrospray of volatile liquids assisted by infrared laser irradiation, Rapid Commun. Mass Spectrometry, No. 26, 2012, pp. 863-869.

Oppelt, et al., Towards a Low Emittance X-Ray FEL at PSI, Proceedings of FEL 2007, pp. 224-227, Novosibirsk, Russia.

* cited by examiner

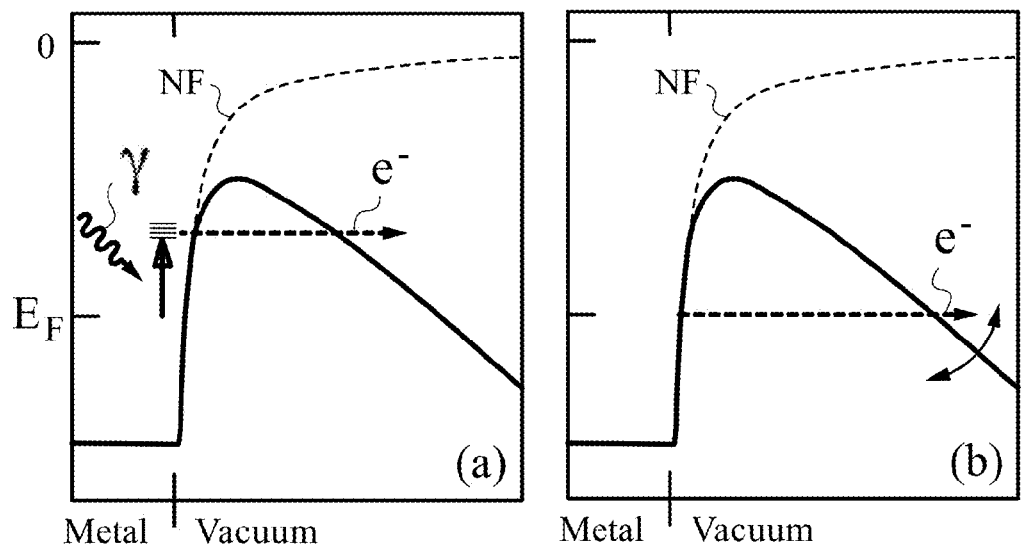
**Fig. 2A
(Prior Art)**
**Fig. 2B
(Prior Art)**
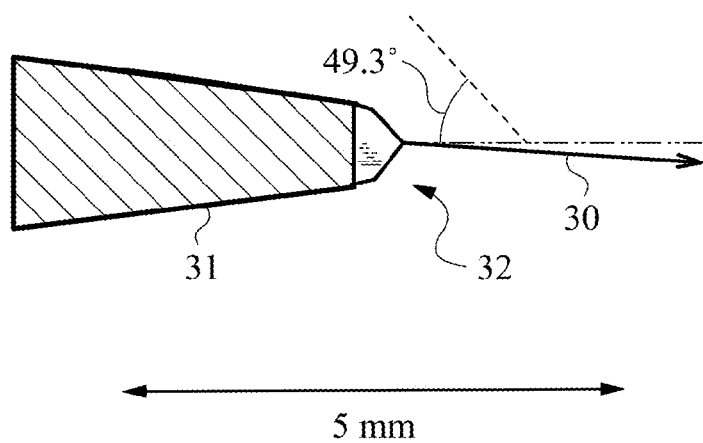
**Fig. 3
(Prior Art)**

BRIGHT AND DURABLE FIELD EMISSION SOURCE DERIVED FROM REFRACTORY TAYLOR CONES

This application claims priority from U.S. Provisional Patent Application No. 61/962,462 filed on Nov. 7, 2013 that is entitled "Bright and Durable Field-Emission Source" and is incorporated herein by reference in its entirety.

GOVERNMENT LICENSE RIGHTS

This invention was made with government support under Grant No. DE-SC0011345 awarded by the Department of Energy on Feb. 18, 2014.

FIELD OF THE INVENTION

This invention relates generally to providing a bright source of charged particles based on the formation of high-temperature Taylor cones. In particular the invention teaches the creation of a bright and durable source of electrons by field emission for use in a variety of electron beam applications, such as electron microscopy, particle accelerators, x-ray sources, and microwave sources.

BACKGROUND

Prior Art

Field Emission

Achieving a reliable and extremely bright source of electrons for applications in the technical area of electron beam (e-beam) instrumentation is a known challenge. At the core of every electron gun used in these sophisticated instruments is the actual source of charged particles. The brightest existing electron sources use the physical process of field emission to liberate electrons from a cathode. This is the first step for the creation of an electron beam from a complete electron gun system. Field emission is a deceptively simple technology first developed in the 1930s. A very sharp needle-like emitter is used as the source of electrons. The radius of curvature at the emitter tip is generally below 1 micron, and often less than 0.1 micron. By placing a high negative voltage on the emitter, electrons are extracted at room temperature from the needle tip by the quantum mechanical process of tunneling. Due to the very small effective source size and very high current densities that are achievable, field emitters are the brightest existing electron sources.

Unfortunately, field emission sources are notoriously unstable during operation due to gas contamination in the imperfect vacuum environment of the instrument. Additionally they sustain damage to their tiny emitter tips due to energetic ions created by collisions of emitted electrons with residual gas atoms. Electron Stimulated Desorption from the anode and other solid structures that electrons encounter also contribute to this ion flux. The resulting damage (sputtering) can very rapidly lead to the complete destruction of a field-emission tip. Thus, despite their unmatched brightness, field-emission sources have not become as ubiquitous as one might expect due to these longstanding issues with operational reliability and lifetime. To achieve a reasonable lifetime, a field-emission gun must be operated under ultra-high vacuum (UHV) conditions. This is costly and undesirable from the point of view of operational convenience.

When a field emitter fails, the electron gun must be brought up to atmospheric pressure, the field emitter replaced, and the system subsequently pumped back down into the UHV range. This process can take over a day due to these extremely stringent vacuum conditions. Accordingly, most electron microscopes use significantly less-bright thermionic emission cathodes in which electrons are emitted by a heated solid. Relatively modest vacuum conditions are adequate for such instruments. A field-emission source having unmatched brightness, high reliability, less reliance on ultra-high vacuum conditions, and extremely long lifetime would be of significant benefit to electron microscopes and other e-beam instrumentation.

Field emitters are most commonly fabricated by electrochemical etching of metal wires. A narrowly tapering cone results in an opening angle that is usually just a few degrees. Tungsten or other refractory metals are generally used. Because the work function varies considerably on different crystal planes of a material, the use of single-crystal wires with a specific orientation is sometimes resorted to in order to confine most of the emission current to a select surface plane residing at the apex of the emitter tip. This increases the brightness and reproducibility of the source.

The end form of the field emitter is crucial, and can be arrived at by several different processes. According to one method, the field emitter is heated to a temperature sufficient for surface diffusion of atoms to occur. This process results in a more blunted surface, with certain low-index atomic planes forming facets. The imposition of a high electric field can also be used to advantage for achieving an improved shape of the end form by a field-induced buildup process. Evaporation of low work-function materials such as zirconium oxide is also sometimes used, with subsequent heating and field build-up to form localized emission planes. Field emitters with such oxide coatings can operate at elevated temperatures to achieve field emission of electrons that are thermally excited to higher energy levels. Such "Schottky thermal field-emitters" have achieved great success in e-beam instrumentation due to their much higher stability, reproducibility, and lifetime as compared to cold field-emission technology. However, they are not able to achieve as bright of an electron beam due to the higher effective source size of the emitter and larger energy spread of the emitted electrons.

An alternate technique for heating a tip to form highly perfect emitter tips is field evaporation. In this process, a positive potential imposed on the emitter removes lattice atoms as positive ions at electrical field strengths of hundreds of megavolts per centimeter. This process even occurs in refractory metals at cryogenic temperatures. Field evaporation can be used to produce tips that have the highest degree of perfection, with a tip end form showing perfect lattice planes intersecting the tip surface. In addition, all atoms of surface contamination will be removed, leaving an atomically clean surface. In some cases, a single atom on the end of a field emitter can be used as the primary field-emission site, which results in the smallest possible electron source, and one having high coherence. By cooling the tip to cryogenic temperatures and adding an imaging gas, atomic resolution inspection of field-emission tips can be achieved using the technique of field ion microscopy to confirm that the desired tip structure is present.

There are a number of limitations inherent in the existing etched-wire field emitter design. The very narrow opening cone angle of the emitter shank presents three deficiencies. First, there is little radial compression of electrons into a more forward-directed beam as they leave the quasi-spherical tip and are accelerated outward. In field emission microscopy, a compression factor β can be expressed by: M=R/βr, where M is the microscope magnification, r is the radius of curvature of the field-emitter, and R is the distance from the tip to a distant detector surface. Narrow cone angles lead to values of β near unity, and a resulting image magnification that is close to the simple radial projection of the spherical end cap of the field emitter onto the distant imaging surface.

While a low value of β can be desirable for field emission and field ion microscopy, large radial divergence of field emitted electrons is less desirable in electron gun designs. Efforts to confine the usable electrons to a limited area of the emitter tip have to be provided to address this issue. A much larger cone-angle results in larger β values, which helps to compress electron emission into a more favorable forward-directed beam. A tip with a large cone angle also requires a higher voltage to achieve the same electric field at the tip, which can be advantageous for the electron gun design.

The second issue inherent in narrow field-emitter taper is that it makes the tip more susceptible to mechanical vibration. If the tip is vibrating laterally, this is equivalent to having a larger effective source and lower resultant brightness.

The third problem with narrow tapers is the poor heat conduction of the shank. This is an issue affecting the removal of heat that is input from a laser when employing the method of laser-assisted field emission. In this process, laser light incident on a field emitter is used to produce short electron pulses synchronized with the light. A wide cone angle is much more effective for heat dissipation, and permits higher incident laser powers.

The physics involved in laser-assisted field emission is rather complex. It depends on photon energy, material work function, ambient temperature, laser intensity and electric field at the tip. In the conceptually simplest case, an electron absorbs enough energy to exceed the work function, and is emitted by classical photoemission, rather than field emission. Due to the very high electric fields present, the effective work function at the emitter tip is lowered by the Schottky effect. Electrons may also acquire sufficient energy to exceed the barrier height by multiphoton absorption. Thus, even infrared photons having much less energy than the work function may generate photoelectrons from a field emitter when high peak-power is used. This type of photoemission from a tip is often of less interest for UEM application than two other processes known as "photofield emission" and "optical field-emission".

In photofield emission, an electron acquires energy at an intermediate bound state above the Fermi level ($E_F$), which is insufficient for standard photoemission. Field emission by tunneling through the potential barrier allows the excited electron to be emitted (also see FIGS. 2A&2B). The voltage on the field emitter is biased to be low enough, so that relatively few electrons are able to tunnel through the comparatively wide potential barrier from Fermi level $E_F$. Instead, almost all the emitted electrons are those excited to a higher energy by the laser pulse, where the barrier is thinner and the tunneling probability is hence increased. In optical field-emission, the oscillating electric field of the laser light is superimposed on the applied electrostatic field, and this modulates the barrier width itself at the laser light frequency. Barrier thinning from the optical field of the laser light increases field emission. In this type of emission, electrons can tunnel directly from Fermi level $E_F$ if the barrier is thin enough. The polarization direction of the laser light is clearly crucial in this case. A very interesting aspect of this process is that electron emission can have a timing precision less than a single photon oscillation period due to the non-linearity of the tunneling process. Barrier penetration and emission mainly occurs at the peak of the optical electrical field. Electron pulses in the attosecond range are conceivable using this effect. It should be understood that several of these different field emission regimes can occur simultaneously. The relative percentage of electrons produced by the separate emission processes is determined by the particular physical parameters existing at the field-emission tip.

Turning our attention back to the types of field emitters, in addition to the etched-wire field emitters, several other types of field emitters have been developed. The main impetus for most of this work has been to make field-emission arrays for display purposes, which have many thousands of emitting tips. However, the possibility of using individual tips in these technologies is conceivable. There are several types of very thin whiskers that have been developed for field emission applications, the best known among these being carbon nanotubes. They have been used both as single field-emitters, as well as area arrays. Metal whiskers have also been studied for similar use. Some work has been done with the attachment of single carbon nanotubes to the end of a standard field emitter, but there are still many challenges in this approach.

Another field emission device is the Spindt cathode. In this technology, very small metal cones are grown by a vacuum-evaporation process through a mask composed of many small holes in a regular array. Typically, cone sizes are on the order of only 1 μm in both height and base diameter. The packing density of these arrays can be very large, with tip spacing of a few microns. The reduced operating voltage of Spindt cathodes helps to reduce the rate of sputtering damage, but the low voltage also presents some issues for electron gun design. This type of cathode does not appear promising for making a bright field-emission gun. In addition to the metal cones of the Spindt cathode, similar structures have been produced with other materials. Diamond cone arrays in particular are a very interesting field emission source, but again, do not appear to be a promising technology for electron guns.

Prior Art

Ultrafast Electron Microscope

Most applications of field emission have used either continuous e-beams, or beams with relatively long pulse durations (milliseconds or longer). However, there are some applications that require electron pulses having much shorter pulses. In particular, remarkable advances in electron microscopy have permitted atomic-resolution imaging and diffraction studies of dynamic processes with temporal resolution below one microsecond, and extending even into the low femtosecond range. The general method has been termed ultrafast electron microscopy (UEM), or sometimes 4D UEM to indicate that the fourth dimension of time is also being observed.

In UEM, millions of separate ultrashort electron pulses can be deployed to collect data sets from a rapidly changing sample using a stroboscopic type of investigation. In some cases, single electrons are used for each pulse to achieve the desired instrumental performance. A modified transmission electron microscope (TEM) is used to realize UEM capabilities. This requires an electron gun that can produce extremely short duration electron pulses at high repetition rates, and with extraordinarily accurate timing precision. As one might expect with such a stroboscopic method, these measurements usually require the observation of processes that are reversible in nature between each incident electron bunch.

For investigations of irreversible processes, a single intense electron pulse may be employed to obtain useful data in a single shot. In this case, Coulomb repulsion in the high-density electron bunch limits temporal resolution to more modest levels that are generally in the nanosecond range. Such single-shot imaging has been termed Dynamic Transmission Electron Microscopy (DTEM). Of interest in the context of the present invention, we consider the several existing versions of UEM, as well as ultrafast electron diffraction (UEC), and ultrafast electron crystallography (UEC) under the blanket term: UEM. Although these different techniques observe samples using slightly different experimental configurations, they all share the commonality of probing samples with ultrashort electron pulses. Another related technique known as Photon Induced Near-Field Electron Microscopy (PINEM) also employs ultrashort electron pulses and is therefore considered to be a version of UEM in the context of this invention.

Among UEM instruments, there have been several approaches developed to produce the requisite pulsed electron beams. All methods rely on some form of photoemission. In the simplest case, this involves electrons liberated from an essentially flat photocathode that is driven by very short-duration laser pulses. This category includes conical $LaB_6$ cathodes with a truncated microflat tip. With standard mode locking techniques, laser pulses can be as short as a few femtoseconds and repetition rates can exceed 1 MHz. For single-shot imaging, chirped pulse amplification techniques can deliver extremely high peak power in the picosecond and femtosecond range. To observe processes with high temporal resolution, a pump-probe experimental arrangement is implemented by using the laser pulses to also activate the dynamic process being studied. The evolution of the sample is observed by varying the delay times between the optical pulse that initiates sample change and the incident light that initiates the electron bunch from the electron source.

A key technical challenge for advancing this field is obtaining electron pulses that broaden as little in duration as possible compared to the instigating laser pulse. A fundamental and limiting issue with femtosecond electron sources involves the Coulomb repulsion of electrons in the bunch. This phenomenon of space charge is a serious impediment for achieving the shortest possible pulse durations. Pulse broadening is greatest when the electrons are at relatively low energies near the cathode. Thus, it is advantageous to use as large of an accelerating electric field gradient as possible to reduce the time period during which the electron bunch is at low kinetic energy. In the case of photoemission cathodes, the use of microwave cavities having large internal electric fields has been found advantageous to minimize pulse broadening. Using single electron packets is an alternative and very effective approach to address the issue of space charge. There is obviously no Coulomb repulsion in a packet if only one electron is present. Of course, this requires many more pulses to get a reasonable signal-to-noise ratio. In the case of single electron pulses, temporal resolution is still determined by the laser pulse duration and any statistical variation in the delay time between the pulse absorption and the electron emission event.

A very desirable source of ultrafast electron pulses employs laser-assisted field emission from an extremely sharp needle-like field emitter. The very high electric field at the emitter tip (near 10 MV/cm) is advantageous for reducing space charge pulse broadening, as most of the acceleration would take place within a few tip radii in this geometry. As with flat photocathodes, this quasi-point source emits electron bunches in synchronization with ultra-short photon pulses from a mode-locked laser to illuminate the minuscule emitter tip. A field-emission cathode thus described is able to produce extremely short pulse durations, while exhibiting superior brightness and coherence due to very low source emittance.

Prior Art

Taylor Cones

The technology of this invention relies on the Taylor cone phenomenon. It is named for Sir Geoffrey Taylor, who in 1964 analyzed what occurs in electrified liquids as electrical charge is increased. He found that a spherical liquid surface gradually becomes more elongated from electrostatic stress until instability sets in at a certain threshold value. At that point, the liquid spontaneously assumes the shape of a cone having a half angle calculated to be 49.3°. This theoretical analysis very closely matches experimental results. The observation of such cones dates back many decades to Taylor's work. The liquid in question can be an isolated droplet, fluid on a solid surface, or the liquid meniscus at the end of a capillary tube. In most cases, the very high electric field at the apex of the Taylor cone will produce a narrow jet of materials, which has been used for processes such as electrospraying and electrospinning. With liquid metals that have appreciably higher surface tension, the results can be different. Instead of producing an electrified jet of material, field evaporation of individual metal ions occurs from a very small cone apex. This type of Taylor cone is commonly known as a Liquid Metal Ion Source (LMIS). It has found productive application in Focused Ion Beam (FIB) systems for nanofabrication. They have also been studied for spacecraft thrusters. The size of the emitting region at low emission current is believed to be extremely small—near 1 nanometer in some cases. To produce a LMIS, one simply increases the voltage on a liquid metal surface located on a small tip until a Taylor cone forms. The metal can reside at the end of a small capillary tube filled with the liquid, or it can be a thin film that wets an underlying solid structure. The latter design is now the standard in LMIS technology, as it generally demonstrates better stability than the capillary source. The most common materials used are the low melting point metals: indium, gallium, tin, and some alloys.

Since Taylor cone formation is polarity independent, a rather obvious idea is to simply reverse the potential of a LMIS, and thereby produce electron field emission from the liquid tip. Such a liquid field emission source would be very attractive because of its complete immunity from sputtering damage. Unfortunately, realizing this is not as straightforward as hoped. In most cases, attempts to form liquid metal electron sources leads to explosive pulsed emission, rather than a constant and stable current. It has been occasionally possible to get stable electron emission using extremely small tip dimensions, and/or employing unusual materials such as liquid lithium. At present, a practical and reliable liquid-metal field emission source remains elusive.

A different concept for using a Taylor cone for electron emission is to operate a LMIS in its normal manner, and let the temperature drop while ion emission is occurring. One might expect that a frozen Taylor cone would result, which could then be used as a field emitter by simply reversing the polarity. This approach has been shown to work to some degree by several investigations as far back as 1978. More recently, the use of such structures has been proposed for spacecraft thrusters. Indium has been the most commonly used metal for this work. Unfortunately, the formation of these frozen field emitters is rather unpredictable and the morphology of the frozen structure is quite irregular. The time interval between the removal of heat to the LMIS and complete solidification is relatively long, which results in an emitter shape that is far from the original liquid Taylor cone shape and surface smoothness. Crystalline grain growth and the reality that metal is still field evaporating from the tip during the slow freezing process are responsible for an alteration from the desirable highly perfect Taylor cone geometry. Very rapid quenching of an operating LMIS would be a more promising course for having the frozen emitter shape closely match the shape and surface smoothness of an operating liquid Taylor cone. However, means to effective such an approach for rapid freezing have not been devised.

The reader is referred to the state of the art as illustrated in FIGS. 1-5. FIG. 1 illustrates a typical UEM system 10. Femtosecond pulses from a mode locked laser 12 are directed at a photocathode 14 to produce ultrashort electron pulses 16. The laser light is split into multiple paths 18, 20 to be directed at photocathode 16 and at a sample 22 with a variable optical time delay 21 to initiate dynamic processes to obtain a time sequence 23 at high spatial and temporal resolution. This pump-probe experimental arrangement is suitable for reversible processes. Irreversible processes can be investigated using a single intense electron pulse.

FIGS. 2A and 2B illustrate photofield emission and optical field emission energy diagrams respectively. In photofield emission, illustrated in FIG. 2A, an electron is excited by a laser photon γ to an intermediate state and then tunnels through the potential barrier. In optical field emission, illustrated in FIG. 2B, the laser field instantaneously wiggles the barrier. If the barrier is sufficiently thin, electrons tunnel from the Fermi level $E_F$. This process is dominant for high fields. Dashed line NF represents the potential barrier in the absence of applied field.

FIG. 3 shows a fluid jet 30 drawn from a Taylor cone 32 in the process of electrospinning. In this example Taylor cone 32 is the meniscus residing at the end of a capillary tube 31. The fluid in a typical case is an aqueous solution. The approximately 49.3° half cone angle calculated by Taylor is evident on the liquid cone and is indicated with reference to the center axis drawn in a dashed and dotted line.

FIGS. 4A&4B show 1 MeV TEM images of an operating LMIS in accordance with the prior art. The liquid in this case is a eutectic Au—Si alloy with a melting point of 363° C. Both Au and Si field evaporate during operation. In FIG. 4A the ion current being drawn from the Taylor cone in the shown image is on the order of 10 μA. In FIG. 4B the current is roughly 100 μA. As is clearly apparent, higher ion currents cause narrowing of cone angle and cusping near the tip region. At very high emission currents, an extremely fine and short liquid jet also forms, with field evaporation occurring at the end of the jet.

FIG. 5 illustrates the formation of local domains as observed in the prior art when a liquid metal Taylor cone employing a metal with a low melting-point is frozen or when heat is dissipated from the liquid metal Taylor cone gradually and inefficiently, resulting in an imperfect profile and poor smoothness of the Taylor cone as it freezes. Such a frozen Taylor cone is undesirable as a field-emitter tip.

OBJECTS OF THE INVENTION

In view of the shortcomings of the prior art, it is an object of the invention to produce an electron source that is more reliably and cost-effectively produced, and is more economical to operate than is possible with prior art approaches.

It is further an object of the invention to produce such an electron source to be powerful and bright and to be employable in a variety of industrial applications.

It is still another object of the invention to be able to replace the emitter tip of such an electron source in-situ, so that the downtime required to replace the tip of a field-emitter is greatly reduced, compared to the techniques currently available.

It is yet another object of the invention to use such an electron source in a complete electron gun that in turn can be used in a variety of industrial applications.

It is also an object of the invention to be able to use refractory materials with higher melting points than is currently possible, in the production of a Liquid Metal Ion Source (LMIS). These and other objects and advantages of the present invention will become apparent upon review of the detailed description and the appended drawing figures.

SUMMARY

The benefits of the present invention are secured by methods for producing a very bright source of charged particles based on Taylor cone formation. A high temperature liquid Taylor cone is created, which is subsequently rapidly quenched to produce a frozen Taylor cone possessing structural characteristics, including a profile and surface smoothness that are very similar to those characterizing the initial liquid Taylor cone. Rapid quenching is substantially enabled by a high flux of thermal radiation emitted from the high temperature Taylor cone after cessation of the heating source, as well as by the high thermal conduction to the Taylor cone substrate. High cooling rates are best achieved using refractory materials, which we define for this invention as having melting points commencing at substantially 1000° C. Moreover, melting points near 2000° C. or greater are preferred for faster cooling, with melting points of over 3000° being especially well suited due to extreme radiative cooling. After solidification, final shaping of the tip of the frozen Taylor cone can be modified by several different physical processes including: field evaporation, thermal evaporation, thermal blunting, and etching in a low pressure reactive gas. Such post treatment can produce end-forms on the frozen Taylor cone tip ranging from blunting into a larger radius semi-spherical shape, to being etched into an atomically sharp point.

In the preferred embodiment, the production of the initial liquid Taylor cone is achieved by heating a solid substrate with focused laser light having sufficient power to melt a small volume of an electrically conductive material in vacuum. The most practical types of lasers are optically-pumped solid state lasers, $CO_2$ gas lasers, and high power direct diode lasers. The output power of the laser can be either continuous, or it may be modulated with a time varying waveform. The use of a focused beam of electrons is an alternative to lasers as means to heat the material. The heated material preferably takes the form of an elongated wire-like substrate. In some cases, a conical preform shape is produced on the substrate, which has an opening angle preferably close to the Taylor cone angle. The molten zone is confined to a small volume located on the unsupported end of this elongated wire-like or conical substrate.

The focused heating beam preferably impinges on the substrate at an angle that is close to on axis with the Taylor cone for symmetrical heating. Simultaneously with heating, a high positive electrical potential is imposed on the substrate to electrostatically form the Taylor cone from the molten material. Cessation of the focused heating beam initiates rapid quenching of the liquid Taylor cone. Freezing and cooling can be implemented by either a sudden and complete cessation of power, or a programmed time sequence of power reduction. Pure refractory metals are preferably the materials used for the substrate. Tungsten, rhenium, tantalum, molybdenum, niobium, hafnium, and the platinum group metals are especially preferable due to their high melting points. However, any materials having sufficient electrical conductivity to form a high-temperature Taylor cone, and having sufficiently low vapor pressure for the required vacuum environment when molten are applicable. Some alternative conductive materials to pure metals include crystalline metal alloys, glassy metal alloys, and refractory compounds such as carbides and borides of the transition metals. In some cases, single-crystal wires can be employed to produce frozen Taylor cones having reproducible crystallographic orientation.

In addition to melting point and thermal conductivity, the chemical reactivity of the material can have significant influence on the quality of the field emitter. This becomes especially true as vacuum conditions become less perfect. Materials that form solid oxides in particular can be more problematic than those that either do not oxidize, or form volatile oxides that readily evaporate. Thus reactive materials like hafnium or zirconium require much better vacuum conditions than noble platinum group elements to avoid oxidation. Metals that have volatile oxides like tungsten and rhenium can work very well, as any oxide layer will evaporate during the tip formation. Finally, some elements like Ta that produce oxide layers that are liquid at the melting point of the metal can form good tips, as the liquid oxide tends to flow away from the tip region to leave a clean surface. The one situation that is generally very undesirable is if a refractory solid oxide thin skin or thicker crust forms on the hot liquid metal.

After creating the frozen Taylor cone and performing any subsequent processing to modify the tip shape, the structure is used as a field emitter by simply reversing the electrical potential from positive to negative. For most applications, the frozen Taylor cone will be used as a field emitter in a complete electron gun system, which also includes a number of auxiliary electrodes held at different electrical potentials to facilitate formation of a collimated electron beam. An optical microscope integrated into the electron gun facilitates inspection of the Taylor cone in both the liquid and solid states. A fiber-optic delivery system can be used for convenient introduction of laser light into the electron gun. This and all additional optics can be pre-aligned in an integrated field emission module. The temperature of the frozen Taylor cone can be near ambient laboratory temperature when functioning as a cold field emission source, or heated to a higher temperature to operate in the Schottky thermal field-emission regime. In the latter case, heating can be achieved by either resistive heating of the field-emitter support, or by using the original heating laser operating at reduced power.

The field emitter can be run at substantially constant current, or be operated in a pulsed mode. For realizing extremely short pulse durations in the nanosecond range and below, laser-assisted field emission is used. In this case, a second laser producing extremely short duration pulses illuminates the frozen Taylor cone to produce electron pulses having duration close to that of the laser. In some instances for investigating irreversible processes, a very intense single pulse of electrons is produced for single-shot imaging applications. In other cases where a reversible process is being studied, a repetitive train of many less intense pulses is desirable, which may consist of only a single electron in each packet.

The frozen Taylor cone structures have a multitude of uses for applications requiring bright charged particle beams. In the general area of electron microscopy, this includes Transmission Electron Microscopy (TEM), Scanning Electron Microscopy (SEM), Electron Microprobe Analysis (EMPA), and Ultrafast Electron Microscopy (UEM). One of the simplest types of microscopes is the point projection electron microscope (PPEM). In this device, the diverging electron beam from a field emitter is used to project the shadow image of a sample onto a distant detection screen. This is accomplished without the use of any intervening electron optics. Essentially, this is a standard field emission microscope, with the addition of a separate sample held very close to the field emitter. Magnification is simply the ratio of the tip to screen distance, divided by tip to sample distance. In addition to DC operation, this type of microscope has been shown to have some advantages for UEM. The close coupling of the tip to the sample minimizes some issues with broadening of the electron pulse. One issue with the PPEM approach is it susceptibility to damage from ion feedback from the nearby sample. A field emitter that can be readily reformed in-situ as with this invention has some significant advantages.

Other applications for this bright field emission source include, but are not limited to, particle accelerator injectors, x-ray sources, and microwave sources. Extremely bright micro-focus x-ray sources employing liquid-metal-jet anodes could especially benefit from the frozen Taylor cone technique. The ability to regenerate a damaged field emission tip in-situ is highly preferable for such applications, and intrinsic to this technology. The brightness of the frozen Taylor cone source is much higher than currently used thermionic emitters for this application, and would permit correspondingly higher anode loading.

In another embodiment it is also possible to use the refractory Taylor cone technology for positive ion beam applications when operating in the initial high-temperature liquid state, and with positive electrical potential. In this situation, field evaporation of ions from the refractory material occurs from the Taylor cone tip. Such a source is a high temperature version of the well-known liquid metal ion source (LMIS), which has previously been limited to use with low melting point metals. Due to the continuous removal of material from this type of LMIS, a motion control system is preferably used for feeding the solid wire substrate into the laser focus can be used. This source can be used for Focused Ion Beam (FIB) instruments with ion species previously not practical with conventional LMIS technology, as well as for other applications requiring bright ion beams. The details of the invention will now be addressed in the detailed description and with reference to the drawing figures.

BRIEF DESCRIPTION OF THE DRAWING FIGURES

FIG. 2A represents the energy diagram of photofield-emission of the prior art.

FIG. 2B represents the energy diagram of optical field-emission of the prior art.

FIG. 3 is a prior art view of a fluid jet drawn from a Taylor cone in the process of electrospinning.

DETAILED DESCRIPTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 6A:
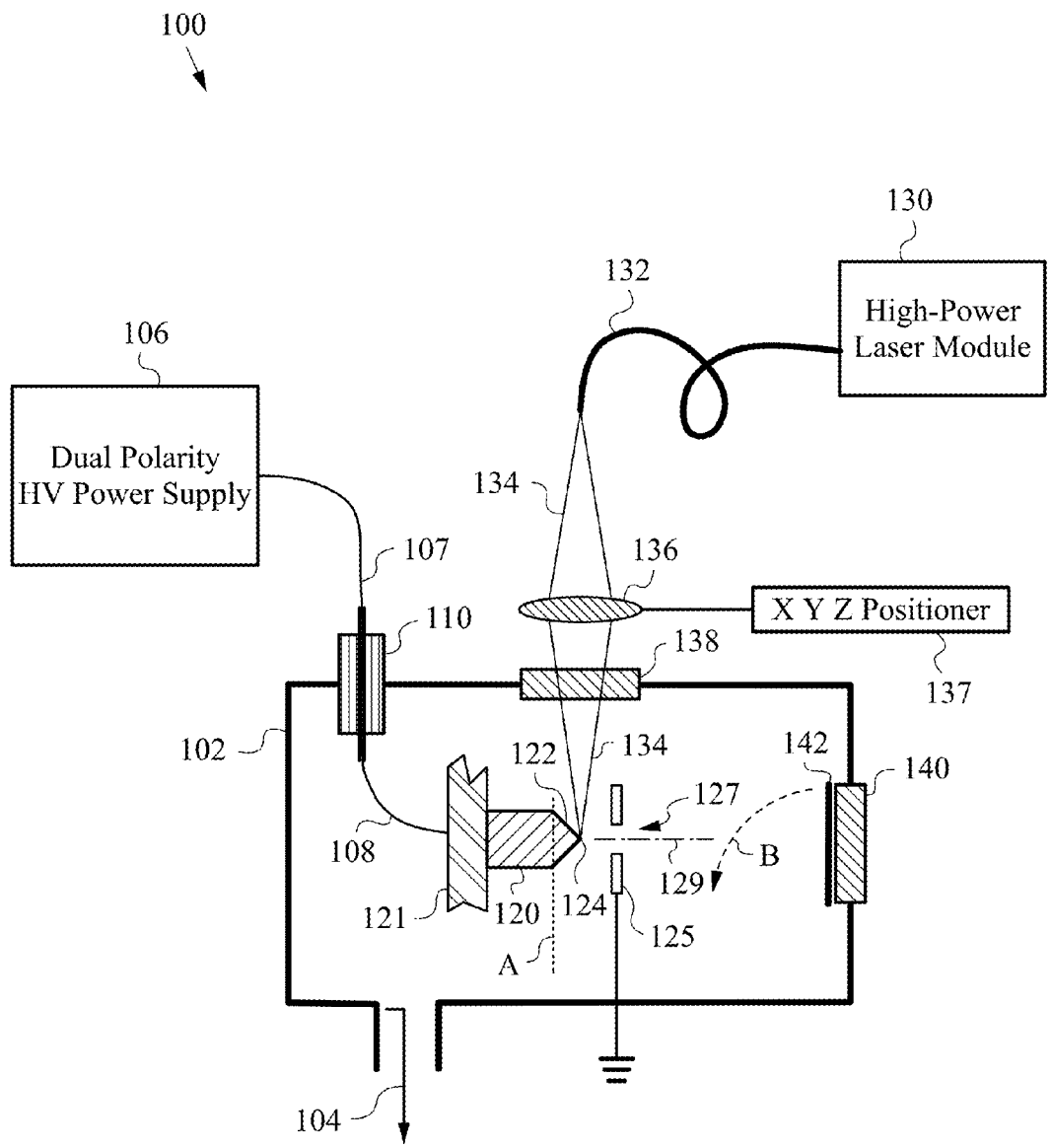
FIG. 6A is a block diagram view of the bright and durable field-emission source according to the current invention.

The present invention will be best understood by first reviewing the bright and durable field emission source 100 according to the methods of the current invention as illustrated in FIG. 6A. The bright and durable field emission source 100 represented in FIG. 6A is provided with a vacuum chamber 102 with a gas outlet 104. FIG. 6A does not show the details of a vacuum pump that will be customarily attached to outlet 104 during the creation of the vacuum in chamber 102. Such details will be obvious to skilled artisans. Bright and durable field emission source 100 is further provided with a dual-polarity high-voltage power supply 106 with a high-voltage cable 107. A feedthrough mechanism 110 serves for passing high voltage from cable 107 into vacuum chamber 102 where an electrical wire 108 is connected. Those skilled in the art will understand that a large variety of options are available to provide the requisite power supply 106, electrical wire 108 and feed-through mechanism 110. For example, wire 108 can be a copper wire and feedthrough mechanism 110 can be built with a ceramic/metal vacuum seal that transfers high voltage power between the outside environment and the vacuum inside chamber 102.

It will also be known to those skilled in the art that in a direct current (DC) environment, an electrical plate connected to the wire carrying the positive voltage or potential is customarily called the anode, and the electrical plate connected to the wire carrying the negative voltage or potential is customarily called the cathode. In FIG. 6A, the wire 108 is connected to electrically conductive material 120 of the current invention in vacuum chamber 102. Conductive material 120 is mounted on a high-temperature ceramic holder 121, as is common in such applications. The arrangement is configured such that the high voltage supplied by wire 108 is applied to conductive material 120. Note that the relative sizes of conductive material 120, holder 121 and remaining components in chamber 102 are not drawn to scale (i.e., typically conductive material 120 is on size scales of just a few millimeters or less).

Since electrically conductive material 120 of the current invention will be used to produce electrons with dual-polarity high-voltage power supply 106 supplying negative voltage or potential to it as will be taught below, we will also use the term cathode when referring to electrically conductive material 120 in the below explanation. In most cases, a second electrode 125 with a central aperture 127 is positioned just in front of cathode 120. Cathode 120 is typically aligned such that its emission axis 129 is along the centerline of aperture 127. Second electrode 125 is commonly referred to as an "extractor electrode". It should be understood that electrode 125 can be either at ground potential, or it can have a positive bias when referenced to cathode 120. Furthermore, cathode 120 can actually be held at ground potential, and extractor electrode 125 can be biased positively by power supply 106. In that case, wire 108 is connected to the extractor electrode 125, rather than to the cathode. For this diagram, we are showing the case where extractor electrode 125 is at ground potential, and cathode 120 connected to the power supply.

It should be noted that in an alternative embodiment of the current invention, the electrically conductive material 120 may also be used as a Liquid Metal Ion Source (LMIS) with wire 108 supplying positive voltage or potential connected to it. In such an embodiment, electrically conductive material 120 may be referred to as an anode.

Turning our attention again to FIG. 6A, we note that the preferred embodiment of the present invention is one in which electrically conductive material 120 will be used to produce electrons according to the following teachings. In this embodiment wire 108 from power supply 106 supplying the positive voltage or potential is connected to electrically conductive material 120, it will be understood by those skilled in the art that the extractor electrode 125 is held at ground potential, or at a more positive potential than 120.

According to the teachings of the present invention a suitable electrically conductive material 120 can be a refractory metal with a high melting point. A key benefit of the current invention is that it allows the choice of high melting point refractory metals for electrically conductive material 120 as opposed to the prior art where only low melting point metals are used. Indeed the choice of the electrical conductive materials that can be used according to the current invention is quite large. A partial list of choices includes the most refractory elements: tungsten, rhenium, tantalum, molybdenum, niobium, hafnium, the platinum group metals, and alloys composed of two or more of the preceding metals. In addition, electrically conductive material 120 can also be an alloy of refractory metals with a tendency to form metallic glass. Additionally it can be a refractory compound, including, but not limited to, a carbide or boride of a transition metal. The use of single crystal materials is also possible for the initial wire, which permits the production of tips having reproducible crystallographic orientations when using appropriate melting and freezing protocols. Such tip production involves a precisely controlled freezing process, which enables the crystallographic orientation of the wire substrate to be retained along the frozen Taylor cone.

As illustrated in FIG. 6A, a Taylor cone 122 is first formed at one end of electrically conductive material 120. Taylor cone 122, which is initially in its liquid form, is created with the aid of a source of focused energy to melt Taylor cone 122. In most embodiments, the focused energy will be a photon beam 134 obtained from a laser source and directed onto electrically conductive material 120. The latter is typically already in the form of a wire substrate, and laser beam 134 is incident on its free end. Melting only occurs at that end. Then a quenching process turns Taylor cone 122 from its liquid form to its frozen form. It is the frozen Taylor cone 122 that is used as a source of electrons for field emission according to the present invention. We will now describe this process in detail. We will also use the term field emitter to refer to frozen Taylor cone 122 or its tip 124, as convenient. Note that in the preferred embodiment, multiple Taylor cones can be produced according to the present invention. Such multiple Taylor cones could all be produced on same holder 121 in any array type as may be useful in particular industrial applications such as electron-beam lithography. However, to facilitate the following explanation, FIG. 6A shows single Taylor cone 122 and the following explanation will enable the methods of the present invention employing this single Taylor cone 122. It will be understood by skilled artisans that this arrangement can be easily replicated to produce multiple Taylor cones in accordance with the present invention.

As mentioned earlier, an advantage of the present invention over prior art is the ability to choose high melting point metals. This, in turn, allows for a faster cooling of liquid Taylor cone 122 and hence a greater likelihood of preserving the ideal or near-ideal structural characteristics, including profile and smoothness. In other words, Taylor cone 122 in its liquid form, through the quenching process, transitions to Taylor cone 122 in its frozen form while preserving the structural characteristics including geometric profile and smoothness obtained in its liquid form. Such high melting point temperatures can range from approximately 1000° to 3000° or higher. Slower cooling associated with low melting point materials as demonstrated in prior art (see, e.g., FIG. 5) can lead to emission tips having unpredictable faceting from crystal growth.

FIG. 6A illustrates the preferred embodiment of the invention, albeit using single Taylor cone 122 for ease of explanation, as mentioned above. In this embodiment a high-power laser module 130 produces a high-power laser beam 134 carried through a waveguide 132, such as a multi-mode fiber. Waveguide 132, in turn, emits laser beam 134 to be guided and shaped by a positioning and focusing lens 136. Lens 136 is further steered by an XYZ positioner 137. In conjunction with positioner 137, lens 136 allows for accurate placement and focusing of laser beam 134 onto tip 124 of Taylor cone 122 in vacuum chamber 102.

In entering vacuum chamber 102 laser beam 134 also passes through a transmissive window 138. Those skilled in the art will realize that many alternative arrangements of the electrical, optical and mechanical components of this arrangement are possible without deviating from the principles of the present invention. For example, lens 136 and window 138 can be combined into a single optic in some embodiments. Similarly, waveguide 132 can be passed directly into vacuum chamber 102 with suitable mechanisms in the same or still other embodiments in order to avoid multiple refractive surfaces and long free-space propagation of laser beam 134. In some designs, focusing optic 136 will be one or more lenses that are situated in-vacuum. FIG. 6A is only meant to be illustrative of the basic principles being discussed.

According to the methods of the present invention, once suitable electrically conductive material 120, the choice of which has been explained above, is placed in vacuum chamber 102, high-power laser beam 134 is focused on its tip 124. Preferably, electrically conductive material 120 is in the form of a wire that may already exhibit a preformed shape of a cone at its tip 124. Such a preform facilitates the initial production of Taylor cone 122 in a precise conical form having a half-angle near the 49.3° characteristic of a Taylor cone. It should be understood that the preforming of the wire with a conical end is not required for this invention. A Taylor cone can be formed directly from a molten mass at the wire end having an initially near-spherical surface. Moreover, other wire profiles with alternate taper angles or discontinuous step profiles are understood to be applicable.

Laser beam 134 of FIG. 6A is powerful enough to melt electrically conductive material 120 placed in vacuum chamber 102. Once electrically conductive material 120 has been melted, simultaneously or soon after, a high positive voltage or potential is generated by dual-polarity high-voltage power supply 106, and applied to material 120. We refer to the substrate portion of material 120 as the base part of Taylor cone 122. This is the shank or body including the terminal or end portion of electrically conductive material 120. The substrate part of Taylor cone 122 can be made of the same material as its tip 124 or it can be of a different material. Such material can be selected for its own conductive, electrical and mechanical characteristics different from tip 124. If a different shank material or body is selected care should be taken to ensure no adverse effects such as melting during the Taylor cone formation process take place.

A positive potential is applied to electrically conductive material 120, which may or may not have an initial conical preform. Since one end of Taylor cone 122 is melted by laser beam 134, the electrostatic forces governed by the spatial field distribution near tip 124 (the solution to which is the first-order Legendre polynomial, as will be familiar to skilled artisans) and surface tension give rise to Taylor cone 122 in its liquid form. The theory behind the formation of Taylor cones is well understood in the art, and will not be delved into detail in the present specification.

Once Taylor cone 122 has attained the desired conical structure in its liquid form, and has formed tip 124 with the desired characteristics to be able to ultimately produce a focused and bright source of electrons, high-power laser module 130 is used to shut off laser beam 134 irradiating liquid Taylor cone 122. While in some embodiments, this cessation of laser beam 134 is sudden and abrupt, allowing Taylor cone 122 to immediately start to cool off, or go through the quenching process, in other embodiments the cessation of laser beam 134 is time sequenced in order to acquire the desired characteristics of Taylor cone 122 and its tip 124.

Although it is possible to form frozen Taylor cone 122 using a continuous wave (CW) laser 130, it is often advantageous to use laser 130 with a time varying waveform. This can result in a more concentrated zone of heating, and a resulting smaller volume and depth of actual melted material at tip 124. This is useful in two respects. First, the quenching rate will be higher. Second, tip 124 will effectively resemble the most reliable LMIS design, which uses a solid tungsten needle with a thin film of molten gallium or indium; rather than a capillary filled with liquid metal. This thin film design is known to operate in a more stable manner. Having a larger volume of liquid metal present tends to make tip 124 more prone to generate uncontrolled spraying of droplets, rather than a well-controlled tip 124 with field evaporating ions. In practice, one normally adjusts the laser power and voltage to produce initial Taylor cone 122. Once the proper cone shape is established, it becomes a simple task to melt the cone end to form a new tip 124 when required. Although shutting off laser 130 as fast as possible will generally result in tip 124 with the smallest radius and smoothest surface figure, there can be times when it is desirable to ramp the laser power down in a controlled manner, and also to adjust the applied voltage and/or current as a function of tip properties. This can produce tips with larger radii and/or extremely small micro-tips on the surface due to crystal growth. The protocol that is followed is dependent on the material used, and exactly what tip end form is desired for a particular application. Very precise control of the heating waveform can be achieved by modulation of the laser module 130.

One advantageous aspect of the present invention over the prior art is derived because the cooling or quenching of liquid Taylor cone 122 happens very fast and largely through radiative processes. This contrasts with the predominantly conductive cooling in prior art approaches, which takes substantially longer. Thus, the present invention allows the user to deploy electrically conductive material 120 with a much higher melting point than possible in the prior art. While in the prior art, the material forming the Taylor cone, as in a Liquid Metal Ion Source (LMIS), is electrically heated, such a heating source is impractical for melting material 120 with a very high melting point.

Figure 5:
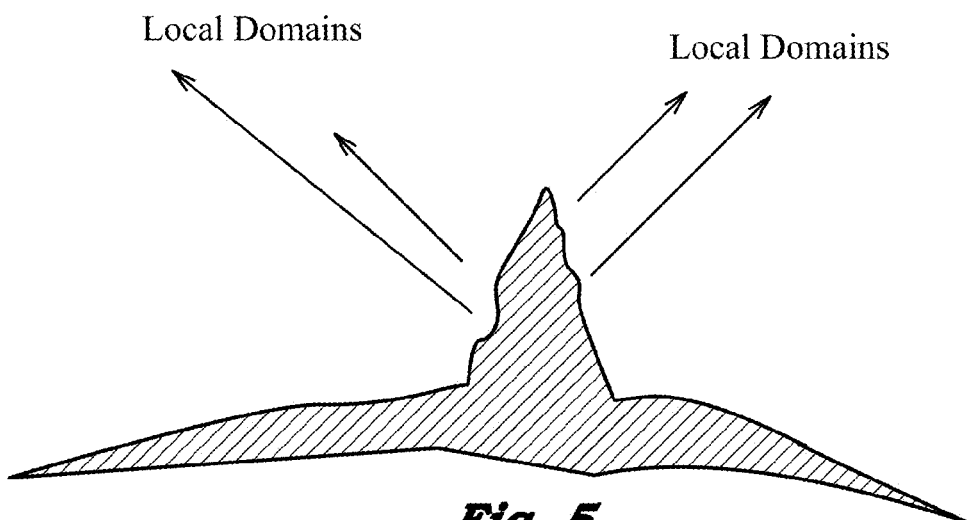
FIG. 5 is a diagram indicating the problematic local domains that emerge during the freezing of a liquid Taylor cone in the prior art.

Those skilled in the art will know that heating or cooling through radiation is proportional to $T^4$ where T is the temperature. Hence, the higher the temperature, the more rapidly the quenching of Taylor cone 122 of FIG. 6A will proceed. It is this fast quenching that allows the present invention to preserve the desired structural characteristics of Taylor cone 122 during the transition from its liquid form to its solid form. Such structural characteristics preferably include the geometric profile of Taylor cone 122 as well as its surface smoothness. These two characteristics significantly reduce and in many cases avoid the production of imperfect local domains that are observed on the surface of prior art frozen Taylor cones as represented in FIG. 5. It should be understood that different physical processes can occur during and after the Taylor cone freezes to change the tip end form. These include thermal evaporation, field evaporation, liquid droplet ejection and surface diffusion. These processes can be fine-tuned by adjustments to the temporal characteristics of the laser power and, in some cases, of the applied voltage.

Finally, dual-polarity high-power power supply 106 is used to reverse the polarity of the applied voltage to electrically conductive material 120 and consequently to Taylor cone 122, now in its frozen form with desired structural characteristics preserved from its liquid form. In other words, instead of applying a positive potential to Taylor cone 122, power supply 106 is now used to apply a negative potential to Taylor cone 122. The negative potential is high enough to liberate electrons from tip 124 of frozen Taylor cone 122 by field emission. As with the liquid Taylor cone, the high potential can alternately be placed on extractor electrode 125. In this case, a positive potential on extractor electrode 125 is used. The electrons thus produced pass through aperture 127 of extractor electrode 125.

At this point, it should be understood that high-power laser module 130 has been switched-off as bright and durable electron source 100 is producing electrons by field emission. The process of field emission of electrons is well understood by skilled artisans. Due to the large opening angle of Taylor cone 122, electrons produced by field emission at tip 124 are directed into a more forward confined cone than those produced from standard field emitters having much smaller cone angles. In addition, the voltage required to reach sufficient field strengths for emission is higher, due to the electrostatic shielding effects of the cone material residing behind the actual emission area. This is desirable in many electron beam designs.

The problem faced by common electron emitters of the prior art due to sputtering is well known. Field-emitters are notorious for their susceptibility to damage in use. Electrons emitted from the tip ionize residual gas atoms, which accelerate back to the emitter tip where cathodic sputtering occurs. Electron stimulated desorption from the anode and other solid structures that electrons impinge upon also contributes to this ion flux. This usually means that ultrahigh vacuum conditions are required for field-emission systems. This susceptibility to damage is the main reason that field-emission has not found as widespread use as one might expect from its apparent simplicity.

The present invention solves the sputtering problem of the field-emitter by allowing an in-situ or in-place regeneration of tip 124 of Taylor cone 122. The regeneration process is explained further. When it is determined that Taylor cone tip 124, which is the electron emitter according to the present invention, needs to be replaced, Taylor cone 122 in its liquid phase as taught above is simply reformed and quenched in-situ to regenerate a new Taylor cone 122 in frozen phase. Explained another way, once a determination to replace Taylor cone 122 has been made, field-emission is temporarily stopped by turning off the negative potential from dual-polarity high-voltage power supply 106 to electrically conductive material 120. Then laser beam 134 produced by high-power laser module 130 is switched on again to reheat electrically conductive material 120 until at least the melting point of the material.

In parallel with this process, or right after it, dual-polarity high-power power supply 106 is used to provide a high positive potential to electrically conductive material 120. This positive potential is high enough to re-form Taylor cone 122 in liquid form, where Taylor cone 122 in its frozen form used to be. Once liquid Taylor cone 122 has achieved the desired characteristics, as can be ascertained by optical inspection apparatus (not shown), laser beam 134 is turned off and quenching commences to turn Taylor cone 122 once again from its liquid form to its solid form. Taylor cone 122 acquiring its solid form essentially constitutes replacing the field-emitter tip. Finally, electric polarity to electrically conductive material 120 is reversed to a high negative potential to again generate electrons from the newly replaced field-emitter tip or Taylor cone tip 124, substantially by field-emission. This process can be repeated as many times as new emitter tips are needed. Notice that electrically conductive material 120 may be consumed and may have to be replenished over the course of the operation of bright and durable electron source 100. Preferably this replenishment is accomplished by a motion control system (not shown) that feeds electrically conductive material 120 that is preferably in the form of a wire.

Instead of completely turning off laser beam power 130, it is alternately possible to run it at reduced power to effect heating of a frozen Taylor cone 122. As mentioned earlier, this is employed in the process of Schottky thermal field emission for producing field emission predominated from electrons that are thermally excited to energy levels above Fermi level $E_f$. This arrangement offers the advantages of thermal field emission, but with the added feature of being capable of higher emission current and brightness due to the ability of the tip to be regenerated whenever necessary. Alternately, heating the field emitter can be accomplished by simply heating the frozen emitter resistively (not shown), as is currently done with standard thermal field emitters.

Bright and durable electron source 100 of FIG. 6A further includes a viewport 140 comprising a glass window with phosphor screen. There is a phosphor shield 142 that covers the phosphor layer to protect it from being coated with evaporated material during the formation of liquid Taylor cone 122. Not shown in the FIG. 6A is an optical microscope, which is used for visual inspection of Taylor cone 122 in both the liquid and frozen states. Obviously, when in the molten state, filters are required to protect one's eyes or any electronic camera from scattered laser light, as well as the intense incandescent light from hot material 120.

Figure 6B:
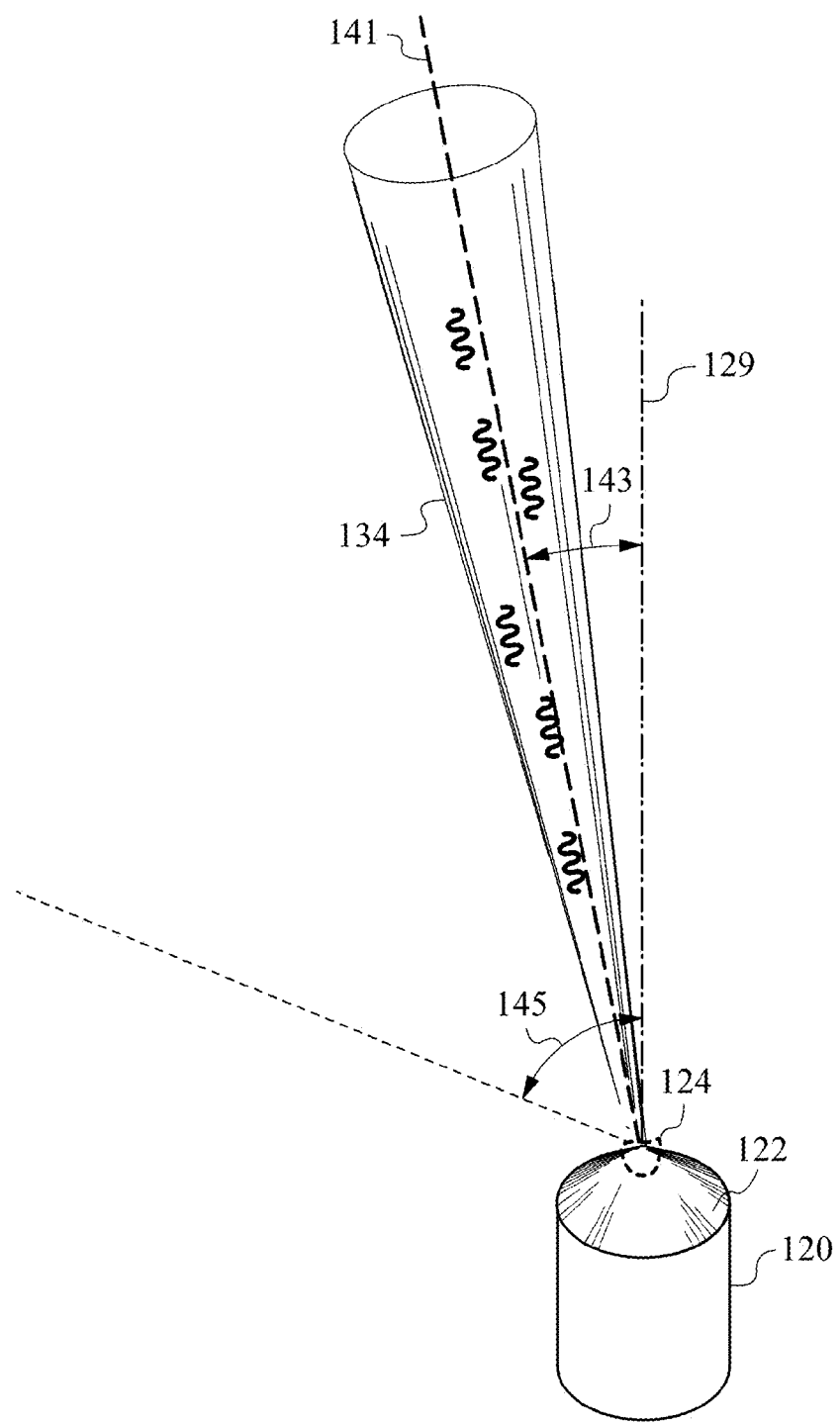
FIG. 6B shows the preferred embodiment of the present invention that focuses the laser beam on the electron emitter from an angle that is on-axis or close to on-axis with the Taylor cone.

FIG. 6B illustrates a preferred embodiment of the invention in which laser beam 134 is targeted onto electrically conductive material 120 along an optical or beam axis 141. Preferably, laser beam 134 is targeted such that beam axis 141 is as close as possible to being coaxial with emission axis 129 of Taylor cone 122. In the case shown, beam axis 141 is off emission axis 129 by a small angle 143 that is preferably less than about 6 degrees as to promote symmetric and uniform heating. In some embodiments, a large angle 145 to emission axis 129, for example up to and beyond normal to emission axis 129 can be assumed. This may be practical due to apparatus geometry as well as in embodiments using an electron beam to heat and melt Taylor cone 122.

Figure 7A:
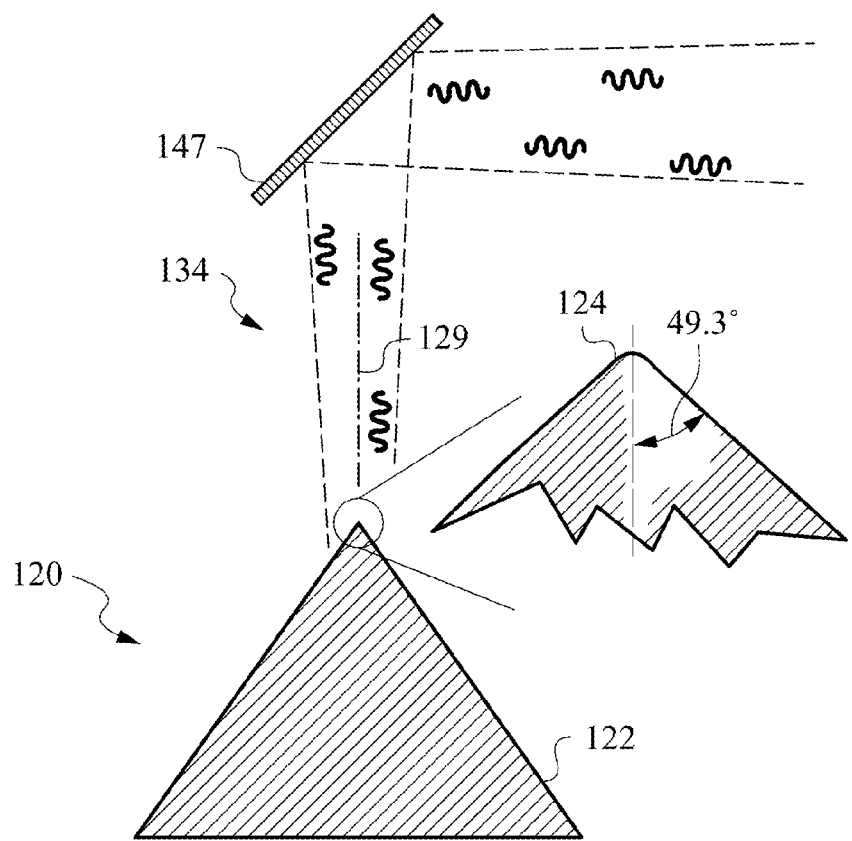
FIG. 7A shows how frozen Taylor cone of the current invention may appear upon close examination.

FIG. 7A shows in detail how frozen Taylor cone 122 may appear on close examination. In FIG. 7A, Taylor cone tip 124 is shown in an exploded view illustrating that tip 124 may not be a point, but rather a narrow and rounded surface. The characteristic Taylor cone half-angle of about 49.3° is also shown. In some cases, processes such as cusping and/or any other processes discussed above and known to those skilled in the art may modify the half-angle substantially.

In the embodiment of FIG. 7A a mirror 147 is used to ensure that Taylor cone 122 is irradiated by laser beam 134 from a direction preferably close to on-axis or along emission axis 129 of Taylor cone 122 to provide symmetrical heating. Clearly, this also permits laser beam 134 to enter the vacuum chamber from a direction significantly off-axis with respect to emission axis 129 of Taylor cone 122. This configuration furthermore has the advantage of not exposing the laser focusing lenses (not shown) to material evaporating from hot tip 124. Mirror 147 can be either set in position permanently, or else moved into position when required to reform Taylor cone 122. A stationary mirror cannot be used as mirror 147 when positioned in the path of the electron beam derived from the final frozen Taylor cone 122 along its emission axis 129.

Figure 7B:
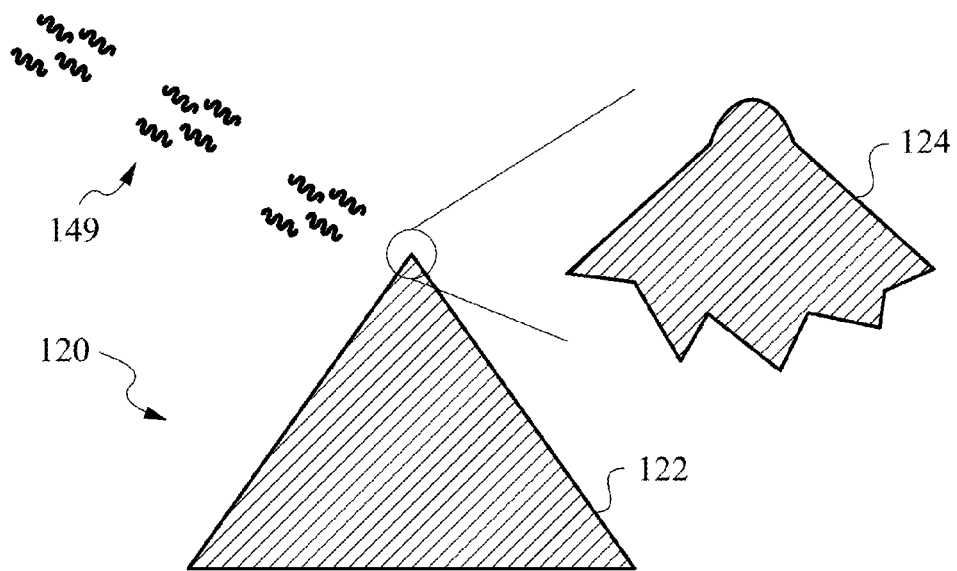
FIG. 7B shows how frozen Taylor cone of the current invention may assume a semi-spherical shape due to thermal blunting.

Notice that in FIG. 7B frozen Taylor cone 122 is being subjected to ultra-fast light pulses 149, which as explained earlier, may contribute to electron production by emitter tip 124 using the process of laser-assisted field emission.

Furthermore, FIG. 7B illustrates that Taylor cone 122 may exhibit a differently shaped tip 124 from the typically sharp one as seen in FIG. 7A. This type of tip shape may be found to develop under real operating conditions. In this case, Taylor cone tip 124 undergoes a process called thermal blunting where instead of achieving a pointed tip 124 of frozen Taylor cone 122, a semi-spherical blunted surface of tip 124 may in fact be achieved. Such a tip is sometimes desirable for producing a more uniform end form on the tip if there is some asymmetry present when initially frozen. In addition, this can be used to produce a larger emitter radius for some high current application. In addition to thermal blunting, several other processes on the as-frozen tip are possible. This includes field evaporation, which will produce the highest quality tip surfaces. Another process is etching in a reactive gas to produce the very sharpest tips. One known example of this is heating of field emitters in oxygen to produce atomically sharp emitter tips. This has been accomplished with success with iridium field emitters.

Figure 8:
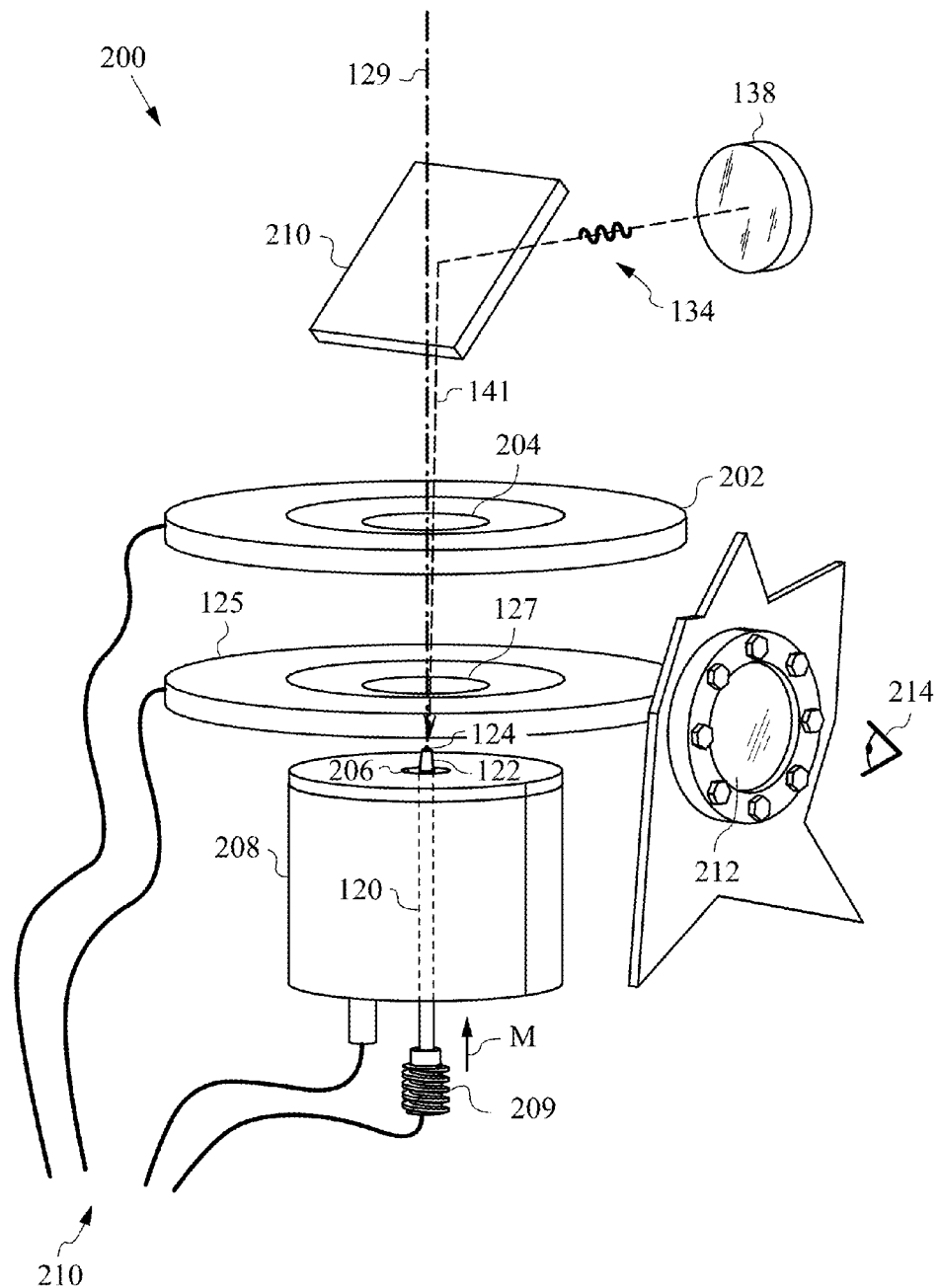
FIG. 8 shows how the bright and durable electron source of the current invention may be used in a complete electron gun.

FIG. 8 shows a preferred embodiment where the bright and durable electron source of the present invention is used in an electron gun 200. Laser beam 134 is shaped by lens 138 and reflected by removable mirror 210 such that beam axis 141 is close to collinear with emission axis 129. Thus, light beam 134 is incident on electrically conductive material 120 and heats up its tip 124 at least to its melting point. To permit the unobstructed passage of beam 134 to tip 124 the customary extractor and anode electrodes 125 and 202 have correspondingly dimensioned holes 127, 204. As is customary in field emission guns, tip 124 of the field emitter protrudes from an aperture 206 in a suppressor electrode 208. In addition, a motion control system 209 can be deployed to move or advance wire material 120 of field emitter 124 in the direction indicated by arrow M. This is done to feed electrically conductive material 120 towards the laser focus as tip 124 is depleted during extended tip formation cycles and operation.

Electrical connections 210 at the back of electron gun 200 provide supply appropriate potentials to the various electrodes and components of electron gun 200. As taught earlier, once the end of electrical conductive material has been melted by laser beam 134, Taylor cone 122 is formed in its liquid form. This Taylor cone 122 has the desired characteristics and tip 124 that in its frozen form will produce a narrow and bright beam of electrons. There are alternate means to illuminate the Taylor cone with the heating laser. The use of a mirror is advantageous for avoiding the coating of the focusing lens with evaporated material. This mirror can also be used to block such evaporated material from entering the column of the instrument. If the mirror is not movable, some sort of movable evaporation shield is desirable beyond the electron gun.

It is possible to design some sources in which the assembly is built with its optics integrated into the gun. This is best realized with a fiberoptic cable that transmits laser power to the assembly. All focusing, including mirrors and lenses are pre-aligned on the source. In addition, a borescope or fiberscope can be a practical means for getting close optical access for viewing the Taylor cone inside the electron gun.

FIG. 8 illustrates a simple viewing port 212 for an optical inspection apparatus 214.

Figure 1:
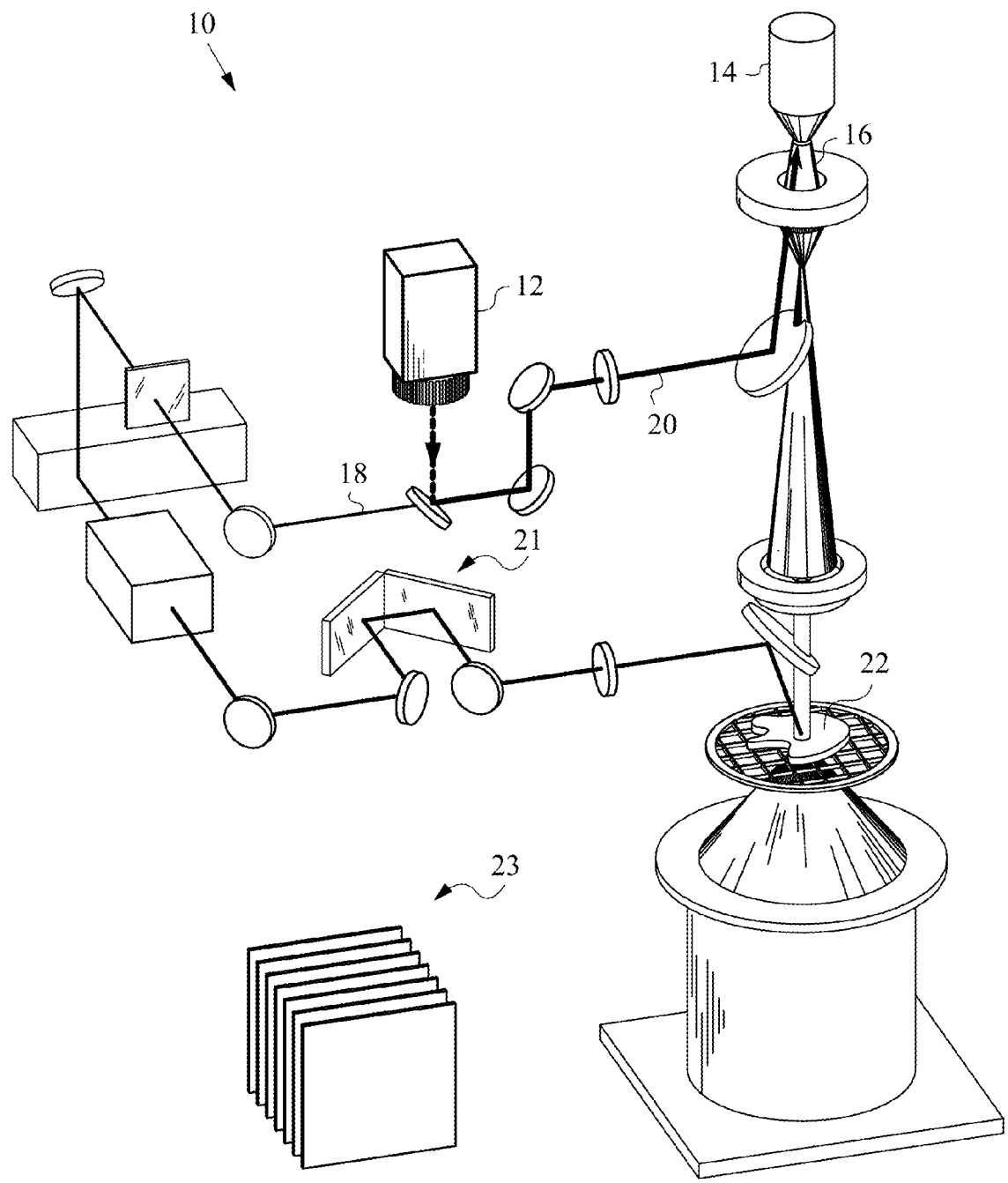
FIG. 1 illustrates a schematic diagram of a typical Ultrafast Electron Microscopy (UEM) system of the prior art.
Figure 4A:
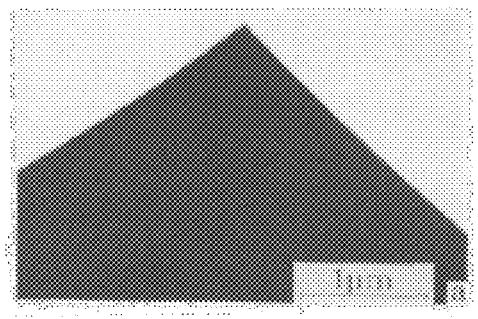
FIG. 4A is a prior art representation of 1 MeV of Transmission Electron Microscopy (TEM) images of an operating Liquid Metal Ion Source (LMIS) at two different ion currents.
Figure 4B:
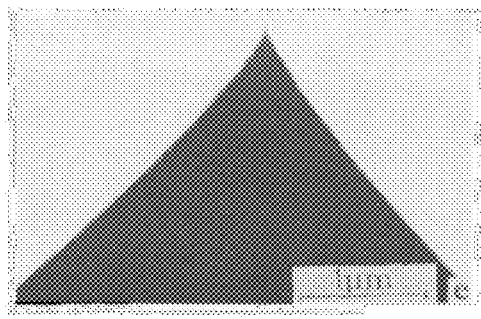
FIG. 4B is a variation of FIG. 4B under increased ion currents.

For laser-assisted field emission, the electron gun design is similar to that used for standard DC operation as shown in 200. However, the voltage on extractor electrode 125 is reduced to prevent strong field emission, except during the brief time when tip 124 is illuminated by very fast laser pulses. The general outline of this instrument has already been shown in FIG. 1.

As previously described, for reversible processes many individual electron bunches are used to build up an image. In some cases, each "bunch" is only a single electron. In other cases when investigating irreversible processes, a complete image must be collected in a single shot. In such instances, a much more powerful laser pulse is used to create a very intense electron pulse. Such operation can lead to rapid deterioration of the field emitter. However, regeneration of the tip is inherently possible with this invention. In the most extreme case, an emitter might have to be regenerated between the acquisition of each image.

Figure 9:
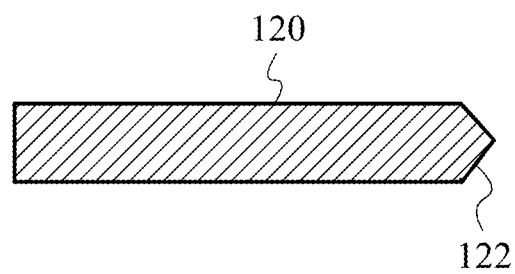
FIG. 9 shows the use of a refractory metal wire with a conical preform shape at its tip as the electrically conductive material used in the formation of the Taylor cone of the present invention.

FIG. 9 illustrates that electrically conductive material 120 preferably is a wire composed of a suitable material as taught above, and further preferably has a conical preform at one end. This facilitates the production of initial liquid Taylor cone 122 as taught above, that has the desired structural characteristics to subsequently produce a frozen Taylor cone for field emission purposes.

In addition to field emission of electrons, the technology inherent with the formation of the field emitters can be used to realize very bright ion beams of elements that have heretofore been impossible to achieve using existing technology. The arrangement used is essentially identical to that shown in FIG. 6A. However, instead of dual-polarity high-voltage power supply 106, a single-polarity high-voltage power supply is adequate, since voltage reversal after the production of liquid metal Taylor cone 122 is not required. However, the heating laser remains on to maintain an ion-emitting liquid Taylor cone. The one significant difference is that wire feed system 209, as shown in FIG. 8, is much more crucial. That is due to the continuous removal of material 120 by field evaporation and thermal evaporation from the hot liquid. For the field-emission electron source, wire feed system 209 is an option, but not required due to the very limited amount of time that electrically conductive material 120 is molten. It should be appreciated that ion emission mode requires better control of Taylor cone operation to have field evaporation not be combined with the spraying of droplets of material from the tip. This is not crucial when forming frozen Taylor cones, since the goal is simply to create the best end form of the field emitter.

In view of the above teaching, a person skilled in the art will recognize that the methods of the present invention can be embodied in many different ways in addition to those described without departing from the principles of the invention. Therefore, the scope of the invention should be judged in view of the appended claims and their legal equivalents.

What is claimed is:

1. A method of producing at least one frozen Taylor cone comprising the steps of:
 (a) providing at least one liquid Taylor cone formed from a refractory electrically conductive material; and
 (b) quenching said at least one liquid Taylor cone under structure-preserving thermal conditions to obtain said at least one frozen Taylor cone having structural characteristics substantially those of corresponding said at least one liquid Taylor cone.

2. The method of claim 1 wherein said structural characteristics comprise profile and smoothness.

3. The method of claim 1 wherein said structure-preserving thermal conditions are enabled by a substantially radiative cooling of said at least one liquid Taylor cone.

4. The method of claim 1 wherein said at least one frozen Taylor cone is further shaped by a process selected from the group consisting of thermal evaporation, field evaporation, thermal blunting and controlled etching in a chemically-reactive low pressure gas.

5. The method of claim 1 wherein said at least one liquid Taylor cone is obtained by the steps comprising:
 (a) placing at least one said refractory electrically conductive material in a vacuum;
 (b) applying a focused energy incident on said at least one refractory electrically conductive material;
 (c) applying a positive potential to said at least one refractory electrically conductive material;
 wherein said focused energy heats said at least one refractory electrically conductive material to at least the melting point of said at least one refractory electrically conductive material, and said positive potential is sufficient to electrostatically form said at least one liquid Taylor cone at the surface of corresponding said at least one refractory electrically conductive material.

6. The method of claim 5 wherein said at least one frozen Taylor cone is further obtained by enabling said quenching by a sudden cessation of said focused energy.

7. The method of claim 5 wherein said at least one frozen Taylor cone is further obtained by enabling said quenching by a time sequenced cessation of said focused energy.

8. The method of claim 5 wherein the tip of said at least one refractory electrically conductive material can be regenerated in-situ by reforming said at least one liquid Taylor cone and subsequently enabling said quenching by a cessation of said focused energy.

9. The method of claim 5 wherein the tip of said at least one frozen Taylor cone is further thermally blunted to a semi-spherical shape.

10. The method of claim 5 wherein the source of said focused energy comprises a laser.

11. The method of claim 10 wherein said laser is selected from the group consisting of $CO_2$ laser, optically-pumped solid state laser, and a high-power diode laser.

12. The method of claim 10 wherein the output power of said laser has a substantially continuous waveform.

13. The method of claim 10 wherein the output power of said laser has a time-varying waveform.

14. The method of claim 5 wherein said focused energy is directed from a position across from said at least one refractory electrically conductive material at an angle substantially aligned with the axes of said at least one liquid Taylor cone and subsequently corresponding said at least one frozen Taylor cone.

15. The method of claim 5 wherein said focused energy comprises an item selected from the group consisting of an electron beam and a plurality of electron pulses.

16. The method of claim 5 wherein the pressure of said vacuum is substantially above Ultra-High Vacuum conditions.

17. The method of claim 5 wherein said at least one refractory electrically conductive material is substantially in the form of a wire.

18. The method of claim 17, wherein said wire is fed by a motion control system as it becomes ablated or is otherwise consumed.

19. The method of claim 5 wherein said at least one refractory electrically conductive material has a conical preform shape.

20. The method of claim 5 wherein said at least one refractory electrically conductive material is a refractory metal selected from the group consisting of tungsten, rhenium, tantalum, molybdenum, niobium, hafnium, the platinum group metals, and an alloy composed of two or more of the preceding metals.

21. The method of claim 5 wherein said refractory electrically conductive material has a tendency to form metallic glass.

22. The method of claim 5 wherein said at least one refractory electrically conductive material is in the form of a single crystal.

23. The method of claim 5 wherein said at least one refractory electrically conductive material is a refractory compound selected from the group consisting of a carbide of a transition metal and a boride of a transition metal.

24. The method of claim 5 wherein said at least one refractory electrically conductive material has a melting point commencing substantially at 1000° C.

25. The method of claim 5 further comprising the steps of:
 (a) removing said positive potential from said at least one frozen Taylor cone;
 (b) applying a negative potential to said at least one frozen Taylor cone; and
 (c) liberating electrons from said at least one frozen Taylor cone substantially by field-emission.

26. The method of claim 25 wherein said at least one frozen Taylor cone is the electron source of an electron gun.

27. The method of claim 26 wherein said electron gun is employed in electron-beam applications including Transmission Electron Microscopy (TEM), Scanning Electron Microscopy (SEM), Scanning Transmission Electron Microscopy (STEM), Point Projection Electron Microscopy (PPEM), Ultrafast Electron Microscopy (UEM), and electron-beam lithography.

28. The method of claim 26 wherein an optical module is integrated with said electron gun that delivers said focused energy inside said electron gun, and is further pre-aligned to target said focused energy onto said refractory electrically conductive material.

29. The method of claim 25 wherein said electrons are used to produce x-rays.

30. The method of claim 25 wherein said electrons are injected into a particle accelerator.

31. The method of claim 25 wherein said electrons are generated as at least one electron pulse.

32. The method of claim 31 wherein said at least one electron pulse has a duration of less than 1 microsecond.

33. The method of claim 31 wherein said at least one electron pulse is generated by laser-assisted field-emission.

34. The method of claim 31 wherein said at least one electron pulse comprises a single electron packet.

35. The method of claim 25 wherein an optical microscope is used for observing said at least one liquid Taylor cone and subsequently corresponding said at least one frozen Taylor cone.

36. The method of claim 25 wherein said electrons are liberated when said at least one frozen Taylor cone is substantially near ambient room temperature.

37. The method of claim 25 wherein said electrons are liberated when said at least one frozen Taylor cone is at a temperature high enough to liberate said electrons substantially in Schottky field-emission regime.

38. The method of claim 37 wherein resistive electrical heating is used to heat said at least one frozen Taylor cone to said high enough temperature to liberate said electrons substantially in Schottky field-emission regime.

39. A method of producing at least one Liquid Metal Ion Source (LMIS) comprising the steps of:
 (a) placing at least one refractory metal in a vacuum, said at least one refractory metal having a melting point commencing substantially at 1000° C.;
 (b) applying a focused energy incident on said at least one refractory metal, said focused energy heating said at least one refractory metal to at least its melting point;
 (c) applying a positive potential to said at least one refractory metal, said positive potential sufficient to form a liquid Taylor cone at the surface of said at least one refractory metal;
 wherein ions are released from said at least one refractory metal substantially by field-evaporation.

40. The method of claim 39 wherein the source of said focused energy is a laser.

41. The method of claim 39 wherein said at least one refractory metal is substantially in the form of a wire.

42. A system of production of charged particles comprising:
 (a) a refractory metal placed in a vacuum, said refractory metal having a melting point commencing substantially at 1000° C.;
 (b) a beam of energy incident on said refractory metal and heating said refractory metal to at least its melting point;
 (c) a positive potential applied to said refractory metal, said positive potential sufficient to form a liquid Taylor cone at the surface of said refractory metal;
 wherein there is a release of said charged particles from said refractory metal.

43. The system of claim 42, wherein said beam of energy comprises a laser.

44. The system of claim 42, wherein said refractory metal is fed into said system by a motion control mechanism as said refractory metal becomes ablated or consumed.

45. The system of claim 42, wherein said release of said charged particles occurs substantially by field-evaporation.

46. The system of claim 42, wherein prior to said release of said charged particles, said liquid Taylor cone is quenched to form a frozen Taylor cone and said positive potential is replaced by a negative potential strong enough to cause said release of said charged particles substantially by field-emission.

47. The system of claim 42, wherein said refractory metal and said liquid Taylor cone are replicated in the form of an array.

* * * * *